(12) United States Patent
Yamada

(10) Patent No.: US 9,035,550 B2
(45) Date of Patent: May 19, 2015

(54) METHOD OF AXIAL ALIGNMENT OF CHARGED PARTICLE BEAM AND CHARGED PARTICLE BEAM SYSTEM

(71) Applicant: JEOL Ltd., Tokyo (JP)

(72) Inventor: Mitsuru Yamada, Tokyo (JP)

(73) Assignee: JEOL Ltd., Tokyo (JP)

( * ) Notice: Subject to any disclaimer, the term of this patent is extended or adjusted under 35 U.S.C. 154(b) by 207 days.

(21) Appl. No.: 13/904,098

(22) Filed: May 29, 2013

(65) Prior Publication Data
US 2013/0320846 A1   Dec. 5, 2013

(30) Foreign Application Priority Data

May 31, 2012   (JP) ................................ 2012-124396

(51) Int. Cl.
*H01J 29/64* (2006.01)
*H01J 37/147* (2006.01)
*H01J 37/153* (2006.01)
*H01J 37/28* (2006.01)

(52) U.S. Cl.
CPC .............. *H01J 29/64* (2013.01); *H01J 37/1471* (2013.01); *H01J 37/153* (2013.01); *H01J 37/28* (2013.01); *H01J 2237/1501* (2013.01); *H01J 2237/1532* (2013.01)

(58) Field of Classification Search
CPC ..... H01J 29/64; H01J 37/1471; H01J 37/153; H01J 37/1428; H01J 2237/1501; H01J 2237/1532
USPC .......................................................... 315/5.35
See application file for complete search history.

(56) References Cited

U.S. PATENT DOCUMENTS 6,486,605 B1 * 11/2002 Beunas et al. ................ 315/5.35

FOREIGN PATENT DOCUMENTS

JP            2007180158 A      7/2007

* cited by examiner

*Primary Examiner* — Hai L Nguyen
(74) *Attorney, Agent, or Firm* — The Webb Law Firm

(57) ABSTRACT

A method of axially aligning a charged particle beam implemented by a charged particle beam system equipped with an astigmatic correction lens including a first pair of coils and a second pair of coils. The method starts with obtaining first to sixth sets of image data while varying currents flowing through the first to fourth coils according to first to sixth sets of conditions. Then, the values of the currents through the first to fourth coils for correcting the position of the axis of the beam are calculated based on the first to sixth sets of image data.

8 Claims, 7 Drawing Sheets

| FRAME | FIRST COIL | | SECOND COIL | | THIRD COIL | | FOURTH COIL | |
|---|---|---|---|---|---|---|---|---|
| | I | i | I | i | I | i | I | i |
| FRAME 1 | $I_1$ | $+i_1$ | $I_1$ | $-i_1$ | $I_1$ | $+i_2$ | $I_1$ | $-i_2$ |
| FRAME 2 | $I_2$ | $+i_1$ | $I_2$ | $-i_1$ | $I_2$ | $+i_2$ | $I_2$ | $-i_2$ |
| FRAME 3 | $I_1$ | $+i_1$ | $I_1$ | $-i_1$ | $I_1$ | $+i_3$ | $I_1$ | $-i_3$ |
| FRAME 4 | $I_2$ | $+i_1$ | $I_2$ | $-i_1$ | $I_2$ | $+i_3$ | $I_2$ | $-i_3$ |
| FRAME 5 | $I_1$ | $+i_4$ | $I_1$ | $-i_4$ | $I_1$ | $+i_2$ | $I_1$ | $-i_2$ |
| FRAME 6 | $I_2$ | $+i_4$ | $I_2$ | $-i_4$ | $I_2$ | $+i_2$ | $I_2$ | $-i_2$ |

| FRAME | FIRST COIL | | SECOND COIL | | THIRD COIL | | FOURTH COIL | |
|---|---|---|---|---|---|---|---|---|
| | I | i | I | i | I | i | I | i |
| FRAME 1 | $I_1$ | $+i_1$ | $I_1$ | $-i_1$ | $I_1$ | $+i_2$ | $I_1$ | $-i_2$ |
| FRAME 2 | $I_2$ | $+i_1$ | $I_2$ | $-i_1$ | $I_2$ | $+i_2$ | $I_2$ | $-i_2$ |
| FRAME 3 | $I_1$ | $+i_1$ | $I_1$ | $-i_1$ | $I_1$ | $+i_3$ | $I_1$ | $-i_3$ |
| FRAME 4 | $I_2$ | $+i_1$ | $I_2$ | $-i_1$ | $I_2$ | $+i_3$ | $I_2$ | $-i_3$ |
| FRAME 5 | $I_1$ | $+i_4$ | $I_1$ | $-i_4$ | $I_1$ | $+i_2$ | $I_1$ | $-i_2$ |
| FRAME 6 | $I_2$ | $+i_4$ | $I_2$ | $-i_4$ | $I_2$ | $+i_2$ | $I_2$ | $-i_2$ |

METHOD OF AXIAL ALIGNMENT OF CHARGED PARTICLE BEAM AND CHARGED PARTICLE BEAM SYSTEM

BACKGROUND OF THE INVENTION

1. Field of the Invention

The present invention relates to a method of axially aligning a charged particle beam and also to a charged particle beam system.

2. Description of Related Art

In recent years, scanning electron microscopes for making observations and measurements on fine structures of living organisms, materials, semiconductors, and so on and charged particle beam systems, such as metrology SEMs used for measurements on semiconductor device circuit patterns, have become known.

In a charged particle beam system, the profile of the charged particle beam (such as an electron beam) needs to have a good circular shape. In a charged particle beam system, the shape of the charged particle beam is corrected by performing astigmatic correction of the charged particle beam.

For example, JP-A-2007-180158 discloses a technique of performing astigmatic correction placing coils of a pair of coils on the opposite sides of an electron beam. If the deflecting forces applied from the opposing coils on the electron beam are out of balance, the beam will be deflected off the center of the optical axis when an astigmatic correction is performed. The deflection moves the field of view being observed. This will impair the observational operability when an astigmatic correction is made. Therefore, it is necessary to adjust the coil currents such that the deflecting forces applied on the electron beam are well balanced even if the values of the currents supplied to the opposing coils are made variable.

For example, JP-A-2007-180158 states that a centering operation (axial alignment of an electron beam) for bringing the position at which the magnetic field strength becomes null into coincidence with the position of the electron beam prior to an astigmatic correction such that the deflecting forces applied on the beam are balanced even if the values of the currents supplied to the opposing coils are made variable. In particular, JP-A-2007-180158 discloses a method of making axial alignment of an electron beam. In this method, the ratio of the currents fed to the opposing coils is varied in turn. At each ratio, the electron beam is scanned. The positions of marks are detected. Also, information about variations of the positions of the marks when the currents fed to the opposing coils are varied is detected. The ratio of the currents which minimizes the variations of the mark positions is regarded as an optimum value for the centering operation.

However, in the electron beam axial alignment method of JP-A-2007-180158, scanning of the electron beam and detection must be conducted repetitively until the centering operation gives rise to an optimum value. Hence, the centering operation is time-consuming to perform. In this way, it may not be easy to perform axial alignment of the electron beam.

SUMMARY OF THE INVENTION

In view of the foregoing problems, the present invention has been made. One object associated with some aspects of the present invention is to offer a method of easily making axial alignment of a charged particle beam.

Another object associated with some aspects of the invention is to offer a charged particle beam system capable of easily making axial alignment of a charged particle beam.

(1) A method of making axial alignment of a charged particle beam in accordance with the present invention is implemented by a charged particle beam system having an astigmatic correction lens including a first pair of coils and a second pair of coils. The first pair of coils consists of first and second coils which are located on opposite sides of the axis of the charged particle beam. The first and second coils have opposite coil surfaces having magnetic poles of a first polarity. The second pair of coils consists of third and fourth coils which are located on opposite sides of the axis of the charged particle beam. The third and fourth coils have opposite coil surfaces having magnetic poles of a second polarity different from the first polarity. The second pair of coils is angularly spaced from the first pair of coils. The method starts with obtaining first to sixth sets of image data while varying currents flowing through the first to fourth coils (that is, the first pair and second pair of coils) according to first to sixth sets of conditions. Then, the values of the currents through the first to fourth coils for correcting the position of the axis of the charged particle beam passing through the astigmatic correction lens are calculated based on the first to sixth sets of image data. Electric current J flowing through each of the first to fourth coils is the sum I+i (J=I+i), where I is a first component of the current J for correcting astigmatism and i is a second component of the current J for correcting the position of the axis of the charged particle beam.

The following description of the first to sixth set of conditions is generally summarized by FIG. 6. Under the first set of conditions, the first components (I's) through the first to fourth coils are equal to each other and equal to a given current value $I_1$. The second currents (i's) through the first and second coils, respectively, are current values $+i_1$ and $-i_1$, respectively, which are equal to each other in absolute value but opposite in sign. The second currents (i's) through the third and fourth coils, respectively, are current values $+i_2$ and $-i_2$, respectively, which are equal to each other in absolute value but opposite in sign. Under the second set of conditions, the first components (I's) through the first to fourth coils are equal to each other and equal to a current value $I_2$ different from the given current value $I_1$. The second components (i's) through the first to fourth coils are current values $+i_1$, $-i_1$, $+i_2$, and $-i_2$, respectively, which are the same as the current values of the second components through the first to fourth coils, respectively, under the first set of conditions. Under the third set of conditions, the first components (I's) through the first to fourth coils are equal to the given current value $I_1$ flowing under the first set of conditions. The second components (i's) through the first and second coils are current values $+i_1$ and $-i_1$, respectively, which are the same as the current values of the second components through the first and second coils, respectively, under the first set of conditions. The second components (i's) through the third and fourth coils are current values $+i_3$ and $-i_3$, respectively, which are equal to each other in absolute value but opposite in sign and which are different in absolute value from the second component through the third coil flowing under the first set of conditions. Under the fourth set of conditions, the first components (I's) through the first to fourth coils are current value $I_2$ which is the same as the current value of the first component through the first coil flowing under the second set of conditions. The second components (i's) through the first to fourth coils are current values $+i_1$, $-i_1$, $+i_3$, and $-i_3$, respectively, which are the same as the current values of the second components through the first to fourth coils, respectively, flowing under the third set of conditions. Under the fifth set of conditions, the first components (I's) through the first to fourth coils are the given current value $I_1$ flowing under the first set of conditions. The second component (i's) through the first and second coils, respectively, are current values $+i_4$ and $-i_4$, respectively, which are equal to each other in absolute value but opposite in sign and which are different in absolute value from the second component through the first coil under the first set of conditions. The second components (i's) through the third and fourth coils, respectively, are current values $+i_2$ and $-i_2$, respectively, which are the same as the current values of the second components through the third and fourth coils, respectively, under the first set of conditions. Under the sixth set of conditions, the first components (I's) through the first to fourth coils, respectively, are current value $I_2$ identical with the current value of the first component through the first coil under the second set of conditions. The second components (i's) through the first to fourth coils, respectively, are current values $+i_4$, $-i_4$, $+i_2$, and $-i_2$, respectively, which are the same as the current values of the second components through the first to fourth coils, respectively, flowing under the fifth set of conditions.

In this method of axial alignment of the charged particle beam, the values of the currents through the first to fourth coils to correct the position of the axis of the charged particle beam can be found from the six sets of image data. In this way, only a limited number of sets of image data need to be required to make axial alignment of the charged particle beam. Consequently, it is easy to make axial alignment of the charged particle beam. This reduces the burden on the operator of the apparatus and can shorten the time taken to make axial alignment of the beam.

(2) Another method of making axial alignment of a charged particle beam in accordance with the present invention is implemented by a charged particle beam system having an astigmatic correction lens including a first pair of coils and a second pair of coils. The first pair of coils consists of first and second coils which are located on opposite sides of the axis of the charged particle beam. The first and second coils are energized with currents flowing in opposite directions, respectively. The second pair of coils consists of third and fourth coils which are located on opposite sides of the axis of the charged particle beam. The third and fourth coils are energized with currents flowing in opposite directions, respectively. The second pair of coils is angularly spaced from the first pair of coils. The method starts with obtaining first to sixth sets of image data while varying the currents flowing through the first to fourth coils according to first to sixth sets of conditions. Then, the values of the currents through the first to fourth coils for correcting the position of the axis of the charged particle beam passing through the astigmatic correction lens are calculated based on the first to sixth sets of image data. Electric current J flowing through each of the first to fourth coils is the sum I+i (J=I+i), where I is a first component of the current J for correcting astigmatism and i is a second component of the current J for correcting the position of the axis of the charged particle beam. Under the first set of conditions, the first components (I's) through the first to fourth coils are equal to each other and equal to a given current $I_1$. The second currents (i's) through the first and second coils, respectively, are current values $+i_1$ and $-i_1$, respectively, which are equal to each other in absolute value but opposite in sign. The second currents (i's) through the third and fourth coils, respectively, are current values $+i_2$ and $-i_2$, respectively, which are equal to each other in absolute value but opposite in sign. Under the second set of conditions, the first components (I's) through the first to fourth coils are equal to each other and equal to a current value $I_2$ different from the given current value. The second components (i's) through the first to fourth coils are current values $+i_1$, $-i_1$, $+i_2$, and $-i_2$, respectively, which are the same as the current values of the second components through the first to fourth coils, respectively, under the first set of conditions. Under the third set of conditions, the first components (I's) through the first to fourth coils are the given current value $I_1$ flowing under the first set of conditions. The second components (i's) through the first and second coils are current values $+i_1$ and $-i_1$, respectively, which are the same as the current values of the second components through the first and second coils, respectively, under the first set of conditions. The second components (i's) through the third and fourth coils are current values $+i_3$ and $-i_3$, respectively, which are equal to each other in absolute value but opposite in sign and which are different in absolute value from the second component through the third coil under the first set of conditions. Under the fourth set of conditions, the first components (I's) through the first to fourth coils are current value $I_2$ which is the same as the current value of the first component through the first coil under the second set of conditions. The second components (i's) through the first to fourth coils are current values $+i_1$, $-i_1$, $+i_3$, and $-i_3$, respectively, which are the same as the current values of the second components through the first to fourth coils, respectively, under the third set of conditions. Under the fifth set of conditions, the first components (I's) through the first to fourth coils are the given current value $I_1$ flowing under the first set of conditions. The second components (i's) through the first and second coils, respectively, are current values $+i_4$ and $-i_4$, respectively, which are equal to each other in absolute value but opposite in sign and which are different in absolute value from the second component through the first coil under the first set of conditions. The second components (i's) through the third and fourth coils, respectively, are current values $+i_2$ and $-i_2$, respectively, which are the same as the current values of the second components through the third and fourth coils, respectively, under the first set of conditions. Under the sixth set of conditions, the first components (I's) through the first to fourth coils, respectively, are current value $I_2$ identical with the current value of the first component through the first coil under the second set of conditions. The second components (i's) through the first to fourth coils, respectively, are current values $+i_4$, $-i_4$, $+i_2$, and $-i_2$, respectively, which are the same as the current values of the second components through the first to fourth coils, respectively, flowing under the fifth set of conditions.

In this method of making axial alignment of the charged particle beam, the values of currents fed to the first to fourth coils for correcting the position of the axis of the beam can be found from the six sets of image data. Since only a limited number of sets of image data need to be obtained for axial alignment of the charged particle beam in this way, it is easy to make axial alignment of the charged particle beam. This reduces the burden on the operator of the apparatus and can shorten the time taken to make axial alignment of the beam.

(3) A further method of making axial alignment of a charged particle beam is based on the method of (1) or (2) above and further characterized in that during the step of calculating the values of the currents, a first image displacement vector indicative of an amount of positional deviation between an image indicated by the first set of image data and an image indicated by the second set of image data, a second image displacement vector indicative of an amount of positional deviation between an image indicated by the third set of image data and an image indicated by the fourth set of image data, and a third image displacement vector indicative of an amount of positional deviation between an image indicated by the fifth set of image data and an image indicated by the sixth set of image data are calculated. The second components (i's) through the first to fourth coils may be calculated based on the first to third image displacement vectors.

(4) A charged particle beam system associated with the present invention is equipped with an astigmatic correction lens including a first pair of coils and a second pair of coils. The first pair of coils consists of first and second coils which are located on opposite sides of the axis of a charged particle beam. The first and second coils have opposite coil surfaces having magnetic poles of a first polarity. The second pair of coils consists of third and fourth coils which are located on opposite sides of the axis of the charged particle beam. The third and fourth coils have opposite coil surfaces having magnetic poles of a second polarity different from the first polarity. The second pair of coils is angularly spaced from the first pair of coils. The charged particle beam system has: image data acquisition means for obtaining first to sixth sets of image data while varying currents flowing through the first to fourth coils, respectively, to first to sixth sets of conditions; and calculation means for calculating the values of the currents flowing through the first to fourth coils for correcting the position of the axis of the charged particle beam passing through the astigmatic correction lens based on the first to sixth sets of image data. Electric current J flowing through each of the first to fourth coils is the sum I+i(J=I+i), where I is a first component of the current J for correcting astigmatism and i is a second component of the current J for correcting the position of the axis of the charged particle beam. Under the first set of conditions, the first components (I's) through the first to fourth coils are equal to each other and equal to a given current value $I_1$. The second currents (i's) through the first and second coils, respectively, are current values $+i_1$ and $-i_1$, respectively, which are equal to each other in absolute value but opposite in sign. The second currents (i's) through the third and fourth coils, respectively, are current values $+i_2$ and $-i_2$, respectively, which are equal to each other in absolute value but opposite in sign. Under the second set of conditions, the first components (I's) through the first to fourth coils are equal to each other and equal to a current value $I_2$ different from the given current value $I_1$. The second components (i's) through the first to fourth coils are current values $+i_1$, $-i_1$, $+i_2$, and $-i_2$, respectively, which are the same as the current values of the second components through the first to fourth coils, respectively, under the first set of conditions. Under the third set of conditions, the first components (I's) through the first to fourth coils are the given current value $I_1$ flowing under the first set of conditions. The second components (i's) through the first and second coils are current values $+i_1$ and $-i_1$, respectively, which are the same as the current values of the second components through the first and second coils, respectively, under the first set of conditions. The second components (i's) through the third and fourth coils are current values $+i_3$ and $-i_3$, respectively, which are equal to each other in absolute value but opposite in sign and which are different in absolute value from the second component through the third coil under the first set of conditions. Under the fourth set of conditions, the first components (I's) through the first to fourth coils are current value $I_2$ which is the same as the current value of the first component through the first coil flowing under the second set of conditions. The second components (i's) through the first to fourth coils are current values $+i_1$, $-i_1$, $+i_3$, and $-i_3$, respectively, which are the same as the current values of the second components through the first to fourth coils, respectively, flowing under the third set of conditions. Under the fifth set of conditions, the first components (I's) through the first to fourth coils are the given current value $I_1$ flowing under the first set of conditions. The second component (i's) through the first and second coils, respectively, are current values $+i_4$ and $-i_4$, respectively, which are equal to each other in absolute value but opposite in sign and which are different in absolute value from the second component through the first coil under the first set of conditions. The second components (i's) through the third and fourth coils, respectively, are current values $+i_2$ and $-i_2$, respectively, which are equal to the current values of the second components through the third and fourth coils, respectively, under the first set of conditions. Under the sixth set of conditions, the first components (I's) through the first to fourth coils, respectively, are current value $I_2$ which is the same as the current value of the first component through the first coil flowing under the second set of conditions. The second components (i's) through the first to fourth coils, respectively, are current values $+i_4$, $-i_4$, $+i_2$, and $-i_2$, respectively, which are the same as the current values of the second components through the first to fourth coils, respectively, flowing under the fifth set of conditions.

In this charged particle beam system, the values of the currents through the first to fourth coils for correcting the position of the axis of the beam can be found from the six sets of image data. Since only a limited number of sets of image data need to be obtained for axial alignment of the charged particle beam in this way, it is easy to make axial alignment of the charged particle beam. This reduces the burden on the operator of the apparatus and can shorten the time taken to make axial alignment of the beam.

(5) Another charged particle beam system associated with the present invention is equipped with an astigmatic correction lens including a first pair of coils and a second pair of coils. The first pair of coils consists of first and second coils which are located on opposite sides of the axis of a charged particle beam. The first and second coils are energized with currents flowing in opposite directions, respectively. The second pair of coils consists of third and fourth coils which are located on opposite sides of the axis of the charged particle beam. The third and fourth coils are energized with currents flowing in opposite directions, respectively. The second pair of coils is angularly spaced from the first pair of coils. The charged particle beam system has: image data acquisition means for obtaining first to sixth sets of image data while varying the currents flowing through the first to fourth coils to first to sixth sets of conditions; and calculation means for calculating the values of the currents through the first to fourth coils for correcting the position of the axis of the charged particle beam passing through the astigmatic correction lens based on the first to sixth sets of image data. Electric current J flowing through each of the first to fourth coils is the sum I+i(J=I+i), where I is a first component of the current J for correcting astigmatism and i is a second component of the current J for correcting the position of the axis of the charged particle beam. Under the first set of conditions, the first components (I's) through the first to fourth coils are equal to each other and equal to a given current value $I_1$. The second currents (i's) through the first and second coils, respectively, are current values $+i_1$ and $-i_1$, respectively, which are equal to each other in absolute value but opposite in sign. The second currents (i's) through the third and fourth coils, respectively, are current values $+i_2$ and $-i_2$, respectively, which are equal to each other in absolute value but opposite in sign. Under the second set of conditions, the first components (I's) through the first to fourth coils are equal to each other and equal to a current value $I_2$ different from the given current value $I_1$. The second components (i's) through the first to fourth coils are current values $+i_1$, $-i_1$, $+i_2$, and $-i_2$, respectively, which are the same as the current values of the second components through the first to fourth coils, respectively, under the first set of conditions. Under the third set of conditions, the first components (I's) through the first to fourth coils are the given current value $I_1$ flowing under the first set of conditions. The second components (i's) through the first and second coils are current values $+i_1$ and $-i_1$, respectively, which are the same as the current values of the second components through the first and second coils, respectively, under the first set of conditions. The second components (i's) through the third and fourth coils are current values $+i_3$ and $-i_3$, respectively, which are equal to each other in absolute value but opposite in sign and which are different in absolute value from the second component through the third coil flowing under the first set of conditions. Under the fourth set of conditions, the first components (I's) through the first to fourth coils are current value $I_2$ which is the same as the current value of the first component through the first coil under the second set of conditions. The second components (i's) through the first to fourth coils are current values $+i_1$, $-i_1$, $+i_3$, and $-i_3$, respectively, which are the same as the current values of the second components through the first to fourth coils, respectively, under the third set of conditions. Under the fifth set of conditions, the first components (I's) through the first to fourth coils are the given current value $I_1$ flowing under the first set of conditions. The second component (i's) through the first and second coils, respectively, are current values $+i_4$ and $-i_4$, respectively, which are equal to each other in absolute value but opposite in sign and which are different in absolute value from the second component through the first coil under the first set of conditions. The second components (i's) through the third and fourth coils, respectively, are current values $+i_2$ and $-i_2$, respectively, which are the same as the current values of the second components through the third and fourth coils, respectively, under the first set of conditions. Under the sixth set of conditions, the first components (I's) through the first to fourth coils, respectively, are current value $I_2$ identical with the current value of the first component through the first coil under the second set of conditions. The second components (i's) through the first to fourth coils, respectively, are current values $+i_4$, $-i_4$, $+i_2$, and $-i_2$, respectively, which are the same as the current values of the second components through the first to fourth coils, respectively, flowing under the fifth set of conditions.

With this charged particle beam system, the values of the currents through the first to fourth coils to correct the position of the axis of the charged particle beam can be found from the six sets of image data. In this way, only a limited number of sets of image data need to be obtained to make axial alignment of the charged particle beam. Consequently, it is easy to make axial alignment of the charged particle beam. This reduces the burden on the operator of the apparatus and can shorten the time taken to make axial alignment of the beam.

(6) A further charged particle beam system associated with the present invention is based on the charged particle beam system of (4) or (5) above and further characterized in that the calculation means calculates a first image displacement vector indicative of an amount of positional deviation between an image indicated by the first set of image data and an image indicated by the second set of image data, a second image displacement vector indicative of an amount of positional deviation between an image indicated by the third set of image data and an image indicated by the fourth set of image data, and a third image displacement vector indicative of an amount of positional deviation between an image indicated by the fifth set of image data and an image indicated by the sixth set of image data. The calculation means may calculate the second components (i's) through the first to fourth coils based on the first to third image displacement vectors.

DESCRIPTION OF THE INVENTION

Figure 1:
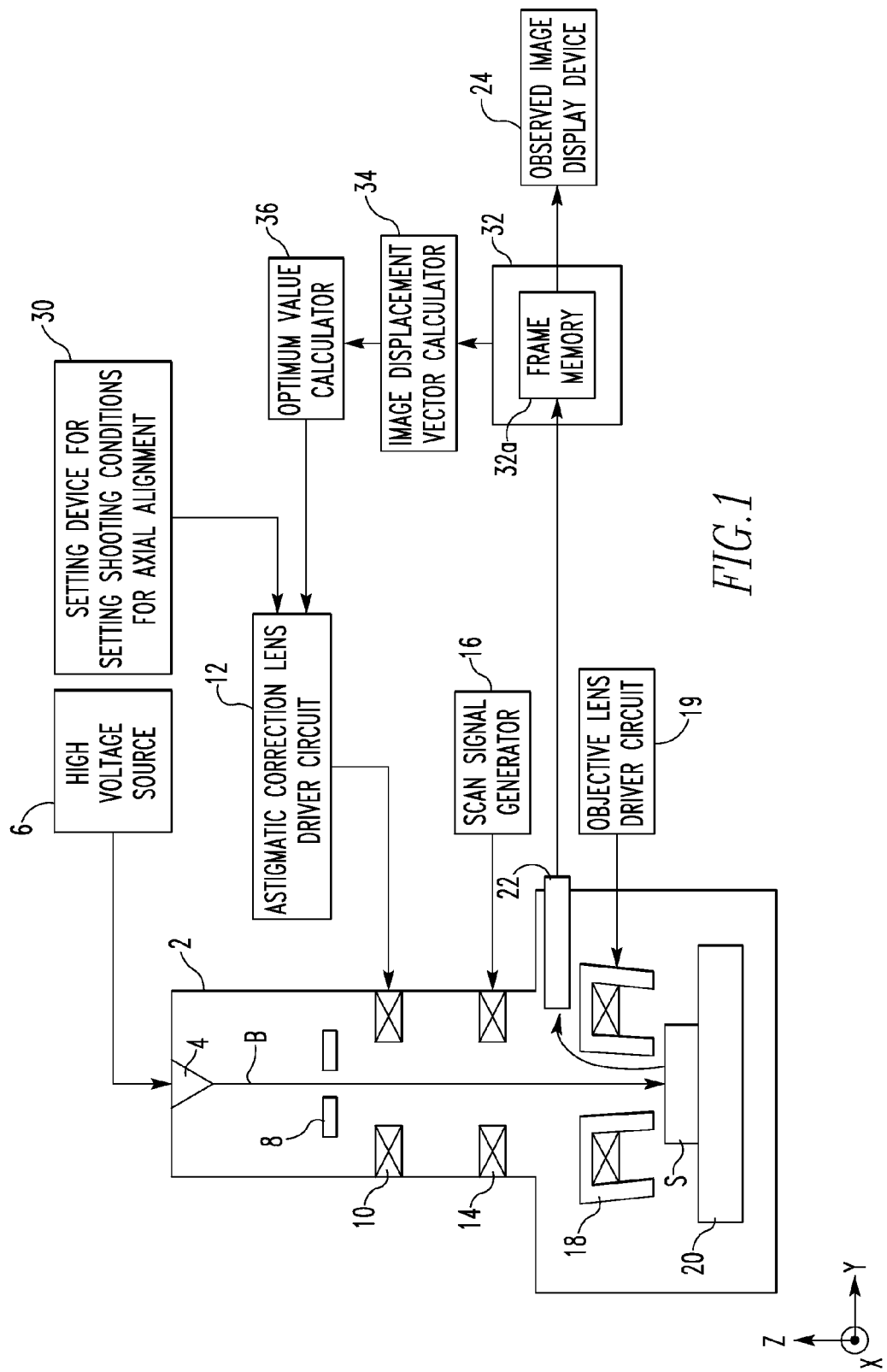
FIG. 1 is a block diagram showing the configuration of a charged particle beam system associated with one embodiment of the present invention.

The preferred embodiments of the present invention are hereinafter described in detail with reference to the drawings. It is to be understood that embodiments described below do not unduly restrict the contents of the invention delineated by the appended claims and that all the configurations described below are not always essential constituent components of the present invention.

1. Configuration of Charged Particle Beam System

The configuration of a charged particle beam system associated with one embodiment of the present invention is now described. The system is generally indicated by reference numeral 100, and it is assumed that the system 100 is a scanning electron microscope (SEM).

As shown in FIG. 1, the charged particle beam system 100 is configured including a charged particle beam source 4, a high voltage source 6 for generating an accelerating voltage, an objective aperture 8, an astigmatic correction lens 10, an astigmatic correction lens driver circuit 12, scan coils 14, a scan signal generator 16, an objective lens 18, an objective lens driver circuit 19, a sample stage 20, a detector 22, an observed image display device 24, a setting device 30 for setting shooting conditions for axial alignment, a memory 32 (including a frame memory 32a), an image displacement vector calculator 34, and an optimum value calculator 36.

For example, the charged particle beam source 4 is made of a well-known electron gun. The beam source 4 accelerates electrons released from a cathode by means of an anode and releases a charged particle beam B (such as an electron beam). No restrictions are imposed on the electron gun used as the charged particle beam source 4. For instance, an electron gun such as a tungsten filament gun, thermal-field-emission gun, or cold-field-emission gun can be used.

The high voltage source 6 for generating the accelerating voltage applies an accelerating voltage to the charged particle beam source 4 to accelerate electrons released from the cathode. The beam B is converged by condenser lenses (not shown) and impinges on the objective aperture 8.

The objective aperture 8 is located at a downstream-side of the charged particle beam source 4, i.e., downstream along the beam B. In the illustrated example, the aperture 8 is spaced from the beam source 4 along the −Z-direction. Alternatively, locating at an upstream-side means to place a constituent element upstream along the beam B, i.e., placing along +Z-direction in the illustrated example. The Z-direction is taken along the optical axis of the objective lens 18. The X-direction and Y-direction perpendicular to the X-direction are perpendicular to the Z-direction. The objective aperture 8 restricts the charged particle beam B traveling for the objective lens 18. For example, the objective aperture 8 passes only the restricted charged particles of the beam B through the objective lens 18 which are close to the optical axis of the objective lens 18 and blocks out the other charged particles.

The astigmatic correction lens 10 is located at a downstream-side of the objective aperture 8 and has plural sets of coils positioned on the opposite sides of the axis of the charged particle beam B. The coils constituting the astigmatic correction lens 10 are supplied with excitation currents from the astigmatic correction lens driver circuit 12. The astigmatic correction lens 10 can correct astigmatism in the beam B. The correction lens 10 and the lens driver circuit 12 will be described in further detail later.

The scan coils 14, which are electromagnetic coils to scan the charged particle beam B over a sample S, are located at a downstream-side of the astigmatic correction lens 10. The scan coils 14 can deflect the beam B in the X- and Y-directions. The scan coils 14 can scan the beam B in two dimensions. The scan coils 14 scan the beam B based on a scan signal from the scan signal generator 16.

The objective lens 18, which focuses the charged particle beam B onto the surface of the sample S, is located at a downstream-side of the scan coils 14. The objective lens 18 is connected with the objective lens driver circuit 19 and supplied with excitation current for exciting the objective lens 18 from the objective lens driver circuit 19.

The sample stage 20 physically supports the sample S and can move the sample S horizontally, up and down, rotate it, and tilt it.

The charged particle beam source 4, objective aperture 8, astigmatic correction lens 10, scan coils 14, and objective lens 18 are housed in a charged particle beam optics column 2.

The detector 22 detects secondary electrons or backscattered electrons released from the surface of the sample S in response to the scanning with the focused charged particle beam B. An intensity signal delivered from the detector 22 in response to the detected secondary electrons or backscattered electrons is stored as image data synchronized with the scanning signal for the beam B into the frame memory 32a. During scanning with the beam B, excitation currents based on the scan signal are supplied to the scan coils 14.

In the illustrated example, the detector 22 is located at an upstream-side of the objective lens 18. Alternatively, the detector may be positioned at a downstream-side of the objective lens 18.

The memory 32 has the frame memory 32a for storing image data. Furthermore, the memory 32 can store shooting conditions under which image data are taken.

The observed image display device 24 displays an SEM image based on the image data stored in the frame memory 32a.

The setting device 30 for setting shooting conditions for axial alignment can derive image data while varying the conditions of the currents flowing through first to eighth coils 101-108 constituting the astigmatic correction lens 10. In particular, the setting device 30 can control the excitation currents through the first to eighth coils 101-108, obtain plural sets of image data while varying the shooting conditions, and store image data and shooting conditions in the memory 32. The setting device 30 is connected with the astigmatic correction lens driver circuit 12 and controls the excitation currents through the first to eighth coils 101-108 via the driver circuit 12.

The image displacement vector calculator 34 and optimum value calculator 36 (that is one example of calculating means) calculate the second exciting current components (i's) (to be explained) of the first to eighth coils 101-108 for aligning the axis of the beam B from the image data stored in the frame memory 32a. The calculated values of the excitation currents are output to the astigmatic aberration correction driver circuit 12 from the optimum value calculator 36.

The image displacement vector calculator 34 calculates an image displacement vector based on two specified images in the frame memory 32a. The optimum value calculator 36 calculates optimum values of the second exciting current components (i's) of the first to eighth coils 101-108 from the image displacement vector found by the image displacement vector calculator 34. The results of the calculation are output to the astigmatic correction lens driver circuit 12, which in turn supplies currents to the first to eighth coils 101-108 based on the results of the calculation.

Figure 2:
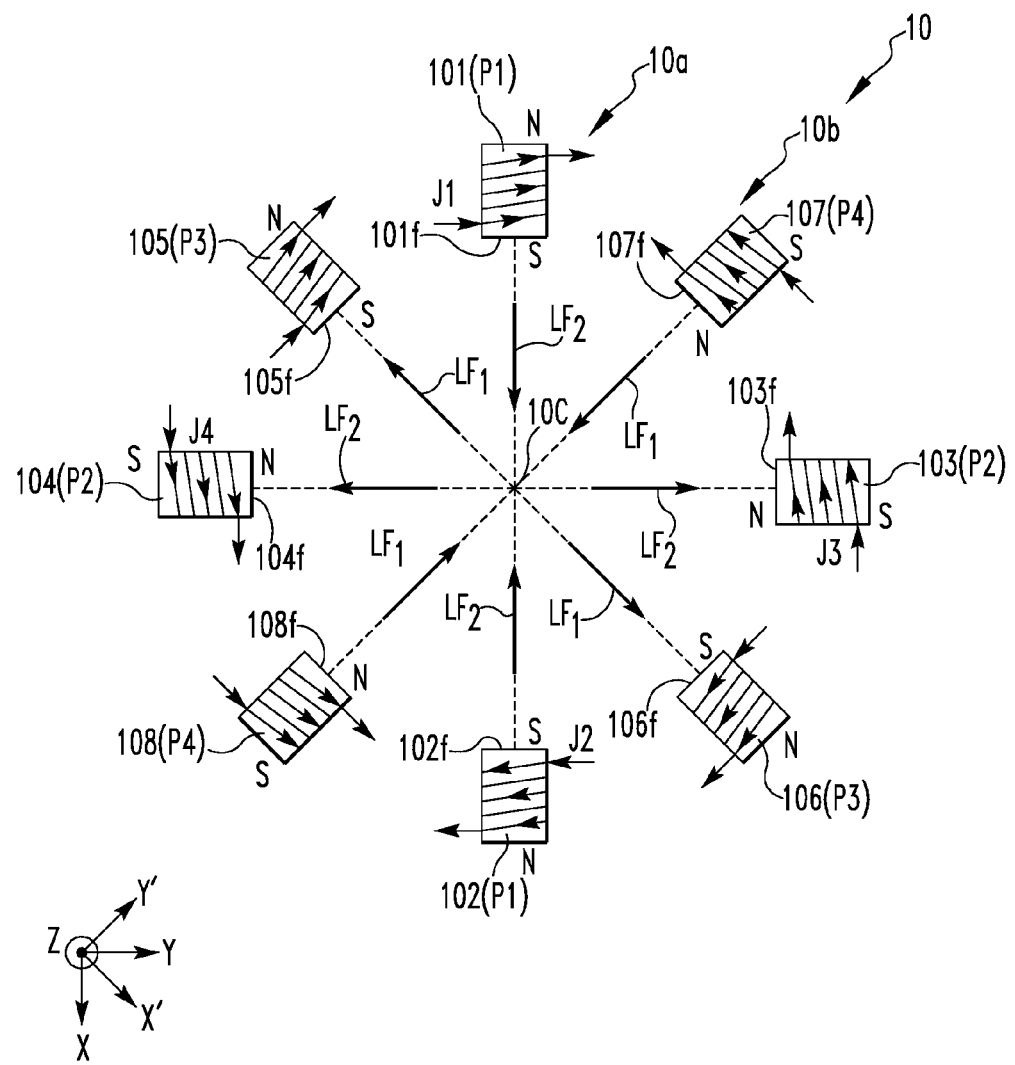
FIG. 2 is a schematic representation of an astigmatic correction lens included in the charged particle beam system shown in FIG. 1, taken along the Z-axis.

FIG. 2 is a schematic representation of the astigmatic correction lens 10 as viewed along the Z-direction. In FIG. 2, the arrows attached to the coils 101-108 indicate the senses of the excitation currents flowing through the coils 101-108.

As shown in FIG. 2, the astigmatic correction lens 10 has a first quadrupole lens 10a and a second quadrupole lens 10b.

The first quadrupole lens 10a has a first pair of coils P1 and a second pair of coils P2. The first pair of coils P1 consists of the first coil 101 and the second coil 102. The second pair of coils P2 consists of the third coil 103 and the fourth coil 104. Each of the first to fourth coils 101-104 is made of a coil that forms a conductive loop. The surface of the conductive loop is perpendicular to the X-Y plane. The first coil 101 and the second coil 102 have coil surfaces 101f and 102f, respectively, which are opposite to each other along the X-direction. The third coil 103 and fourth coil 104 have coil surfaces 103f and 104f, respectively, which are opposite to each other along the Y-direction that is perpendicular to the X-direction.

The first coil 101 and second coil 102 forming the first pair of coils P1 are energized with currents of opposite senses. Therefore, the coil surface 101f of the first coil 101 and the coil surface 102f of the second coil 102 which are opposite to each other are polarized identically. In the illustrated example, the opposite coil surfaces are polarized south (may be herein referred to as of the first polarity). In the first coil 101, electric current flows through the upper surface (extending in the +Z-direction) of the coil in the +Y-direction. In the second coil 102, electric current flows through the upper surface of the coil (extending in the +Z-direction) in the −Y-direction.

The third coil 103 and fourth coil 104 forming the second pair of coils P2 are energized with currents of opposite senses. Therefore, the coil surface 103f of the third coil 103 and the coil surface 104f of the fourth coil 104 which are opposite to each other are polarized identically. In the illustrated example, these opposite surfaces are polarized north (may be herein referred to as of the second polarity). In the third coil 103, electric current flows through the upper surface of the coil (extending in the +Z-direction) in the −X-direction. In the fourth coil 104, electric current flows through the upper surface of the coil (extending in the +Z-direction) in the +X-direction.

A Lorentz force $LF_1$ acts on the charged particle beam B passing through the first quadrupole lens 10a by the magnetic field created by the four coils 101-104 constituting the first quadrupole lens 10a. In the illustrated example, the first quadrupole lens 10a generates a magnetic field that diverges the beam B in an X'-direction and converges the beam B in a Y'-direction perpendicular to the X'-direction within a plane perpendicular to the axis of the beam B. The Y'-direction is the direction of a Y'-axis obtained by rotating the Y-axis about the Z-axis through 45°. The X'-direction is the direction of an X'-direction obtained by rotating the X-axis about the Z-axis through 45°. The first quadrupole lens 10a can produce astigmatism by means of the four coils 101-104, thus canceling out the astigmatism in the charged particle beam B.

The second quadrupole lens 10b has a third pair of coils P3 and a fourth pair of coils P4. The third pair of coils P3 consists of the fifth coil 105 and the sixth coil 106. The fourth pair of coils P4 consists of the seventh coil 107 and the eighth coil 108. Each of the fifth through eighth coils 105-108 is made of a coil forming a conductive loop whose surface is perpendicular to the X-Y plane. The fifth coil 105 and sixth coil 106 have coil surfaces 105f and 106f, respectively, which are opposite to each other along the X'-direction. The seventh coil 107 and eighth coil 108 have coil surfaces 107f and 108f, respectively, which are opposite to each other along the Y'-direction.

The fifth coil 105 and sixth coil 106 forming the third pair of coils P3 are energized with currents of opposite senses. Therefore, the coil surfaces 105f and 106f of the fifth coil 105 and sixth coil 106, respectively, which are opposite to each other are polarized south. In the illustrated example, the opposite surfaces 105f and 106f are polarized identically (i.e., polarized to have the first polarity). Electric current flows in the +Y'-direction through the upper surface of the fifth coil 105 extending in the direction +Z-direction. Electric current flows in the −Y'-direction through the upper surface of the sixth coil 106 extending in the +Z-direction.

The seventh coil 107 and eighth coil 108 constituting the fourth pair of coils P4 are energized with currents of opposite senses. Therefore, the coil surface 107f of the seventh coil 107 and the coil surface 108f of the eighth coil 108, which are opposite to each other, are polarized identically. In the illustrated example, these opposite surfaces 107f and 108f are polarized north (i.e., polarized to have the second polarity). In the seventh coil 107, electric current flows in the −X'-direction through the upper surface of the coil extending in the +Z-direction. In the eighth coil 108, electric current flows in the +X'-direction through the upper surface of the coil extending in the +Z-direction.

A Lorentz force $LF_2$ acts on the charged particle beam B passing through the second quadrupole lens 10b by the magnetic field generated by the four coils 105-108 forming the second quadrupole lens 10b. In the illustrated example, the second quadrupole lens 10b sets up a magnetic field which diverges the beam B in the Y-direction and which converges the beam in the X-direction perpendicular to the Y-axis within a plane perpendicular to the axis of the beam B. The second quadrupole lens 10b can produce astigmatism by means of the four coils 105-108, thus canceling out the astigmatism in the beam B. In this way, the astigmatic correction lens 10 is an octupole lens including the two quadrupole lenses 10a and 10b which are angularly spaced from each other by 45°. Each of the quadrupole lenses 10a and 10b consists of four lenses.

A Lorentz force acting on the charged particle beam B passing through the octupole lens is produced according to the principle of superposition from both the Lorentz force $LF_1$ generated from the first quadrupole lens 10a and the Lorentz force $LF_2$ generated from the second quadrupole lens 10b.

Consequently, the astigmatism in the charged particle beam B can be corrected in terms of arbitrary angle (direction) and intensity within the X-Y plane by adjusting the sense and intensity of the current through the first quadrupole lens 10a and the sense and intensity of the current through the second quadrupole lens 10b.

Figure 3:
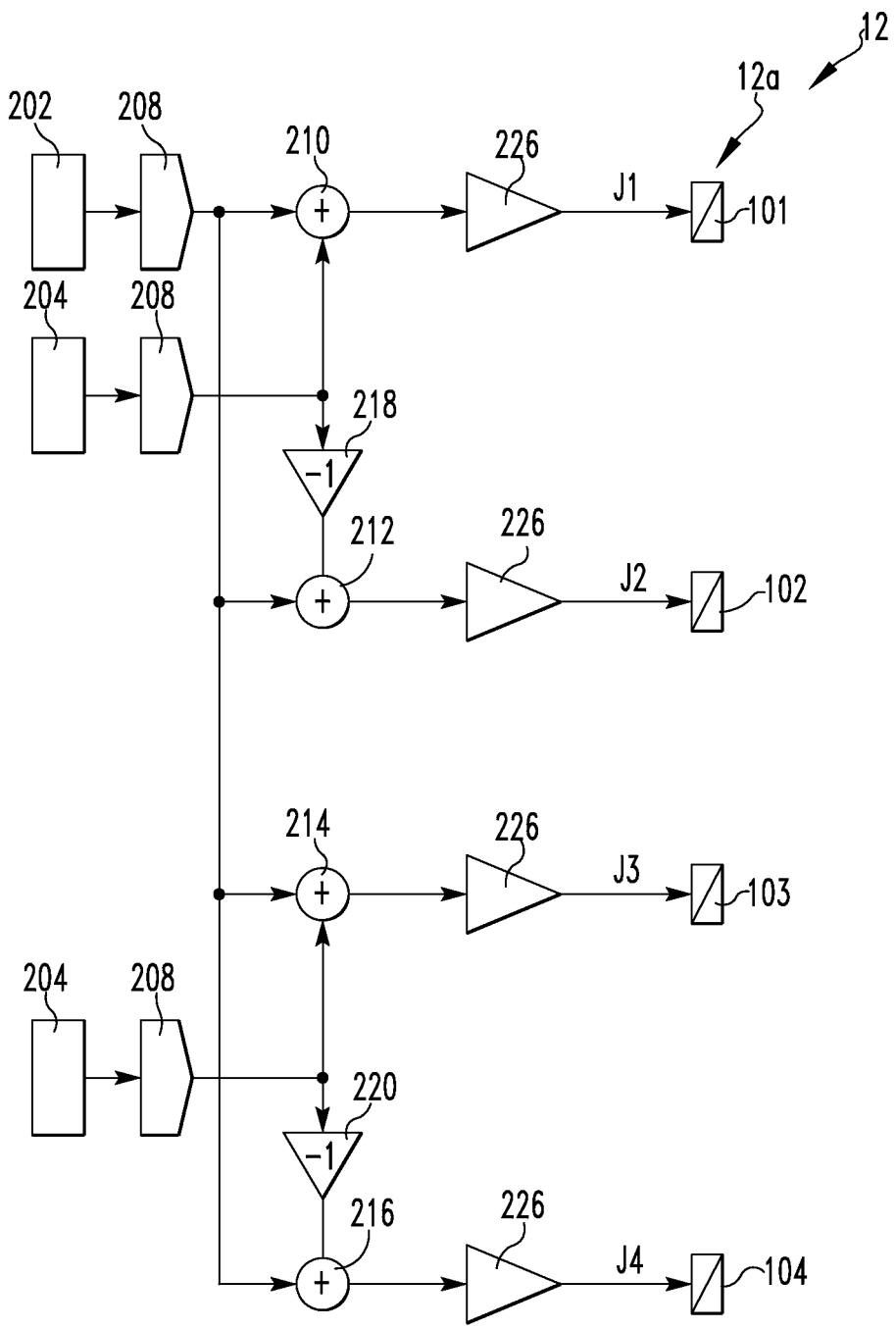
FIG. 3 is a circuit diagram of an astigmatic correction lens driver circuit included in the charged particle beam system shown in FIG. 1.

The currents flowing through the first to eighth coils 101-108 are supplied from the astigmatism correction lens driver circuit 12. FIG. 3 illustrates the configuration of the lens driver circuit 12. The driver circuit 12 includes a circuit portion 12a for supplying current to the first quadrupole lens 10a, and only this circuit portion 12a is shown in FIG. 3. This circuit portion 12a is described below by referring to FIG. 3.

Excitation currents J1, J2, J3, and J4 flow through the first to fourth coils 101-104, respectively, constituting the first quadrupole lens 10a. Each of the excitation currents J1-J4 can be represented by the sum I+i, where I is a first component of the current for correcting the astigmatism and i is a second component of the current for correcting the position of the axis of the charged particle beam B. That is, in the first quadrupole lens 10a, the degree to which the astigmatism is corrected is determined by the current values of the first components (I's) of the excitation currents J1-J4 through the first to fourth coils 101-104. The position of the axis of the beam B within the plane perpendicular to the axis of the beam B is determined by the second components (i's) of the excitation currents J1-J4 through the first to fourth coils 101-104. In each of the coils 101-104, as the current value of the excitation current increases in absolute value, the magnetic field becomes stronger. Also, the astigmatism produced in the first quadrupole lens 10a becomes greater. In each of the coils 101-104, if the current assumes a negative value, the current is opposite in sense to the case where the current assumes a positive value.

The astigmatic correction lens driver circuit 12 has registers 202, 204, 206, DA converters 208, adders 210, 212, 214, 216, inverting amplifiers 218, 220, and voltage-current converting amplifiers 226.

Data about the current values of the first components (I's) of the excitation currents J1-J4 through the first to fourth coils 101-104 is loaded into the register 202. Data about the absolute values of the current values of the second components (i's) of the excitation currents J1 and J2 through the coils 101 and 102 are loaded into the register 204. Data about the absolute values of the current values of the second components (i's) of the excitation currents J3 and J4 through the coils 103 and 104 is loaded into the register 206. These sets of data can be set by the axial alignment shooting condition setting device 30. It is now assumed that the current value $I_1$ is loaded in the register 202, the current value $i_1$ is loaded in the register 204, and the current value $I_2$ is loaded in the register 206. Data about the current values $I_1$, $i_1$, and $I_2$ loaded in the registers 202, 204, and 206 is converted from digital electrical signals into analog electrical signals by the respective DA converters 208 and fed to the adders 210, 212, 214, and 216. The signal supplied to the adder 212 via the corresponding DA converter 208 from the register 204 is inverted by the inverting amplifier 218. Similarly, the signal supplied to the adder 216 via the corresponding DA converter 208 from the register 206 is inverted by the inverting amplifier 220. Therefore, in the adder 210, the signal $I_1$ from the register 202 and the signal $i_1$ from the register 204 are summed up. Similarly, in the adder 214, the signal $I_1$ from the register 202 and the signal $i_2$ from the register 206 are summed up. In the adder 212, the signal $I_1$ from the register 202 and the inversion, $-i_1$, of the signal from the register 204 are summed up. In the adder 216, the signal $I_1$ from the register 202 and the inversion, $-I_2$, of the signal from the register 206 are summed up. Electric currents are supplied from the adders 210, 212, 214, and 216 to the coils 101-104, respectively, via the respective voltage-current converting amplifiers 226. As a result, the excitation current J1 supplied to the first coil 101 is J1=$I_1+i_1$. The excitation current J2 supplied to the second coil 102 is J2=$I_1-i_1$. The excitation current J3 supplied to the third coil 103 is J3=$I_1+i_2$. The excitation current J4 supplied to the fourth coil 104 is J4=$I_1-i_2$.

In this way, the astigmatic correction lens driver circuit 12 supplies currents such that the current values of the first components (I's) of the excitation currents J1-J4 through the first to fourth coils 101-104 are equal to each other and equal to the current value $I_1$. Furthermore, the lens driver circuit 12 supplies currents such that the second component i of the excitation current J1 through the first coil 101 and the second component i of the excitation current J2 through the second coil 102 are current values $+i_1$ and $-i_1$, respectively, which are opposite in sign and equal in absolute value. In addition, the lens driver circuit 12 supplies currents such that the second component i of the excitation current J3 through the third coil 103 and the second component i of the excitation current J4 through the fourth coil 104 are current values $+i_2$ and $-i_2$, respectively, which are opposite in sign and equal in absolute value. Consequently, if the second components (i's) of the excitation currents through the coils 101-104 for adjusting the position of the axis of the charged particle beam B are varied, the total amount of excitation current flowing through the whole astigmatic aberration correction lens B does not vary. Accordingly, the position of the axis of the beam B and correction of the astigmatism can be adjusted independently.

When the charged particle beam B passes through the first quadrupole lens 10a and the position of the axis of the beam B is coincident with the central axis 10C of the lens 10a, the position of the axis of the beam B does not vary even if the degree of astigmatism produced by the first quadrupole lens 10a varies (i.e., if the current values of the first components I of the currents through the coils 101-104 vary). At the position of the central axis 10C of the first quadrupole lens 10a, the resultant of the Lorentz forces $LF_1$ acting in mutually opposite directions and on the beam B in response to energization of the first to fourth coils 101-104 is zero for all the cases of the directions.

The central axis 10C of the first quadrupole lens 10a moves according to the current values of the second component (i's) of the excitation currents J1-J4 through the first to fourth coils 101-104. Therefore, it is possible to make axial alignment of the beam B by finding the current values of the second components (i's) of the excitation currents J1-J4 through the first to fourth coils 101-104 at which the position of the axis of the beam B is coincident with the position of the central axis 10C of the first quadrupole lens 10a. Where astigmatism in the charged particle beam B is corrected, the first components (I's) of the excitation currents J1-J4 through the first to fourth coils 101-104 are varied while maintaining constant the current values of the second components (i's) of the excitation currents J1-J4 through the first to fourth coils 101-104. In this case, the position of the central axis 10C of the first quadrupole lens 10a does not vary although the amount of correction to the astigmatism changes.

The circuit portion of the astigmatic correction lens driver circuit 12 that supplies current to the second quadrupole lens 10b is similar to the circuit portion 12a for supplying current to the first quadrupole lens 10a and so its description is omitted. The first component I and the second component i of the excitation current flowing through the second quadrupole lens 10b are independent of the first components (I's) and second components (i's) of the excitation currents J1-J4 through the first quadrupole lens 10a. That is, the first component I and the second component i of each of the excitation currents J1-J4 through the first quadrupole lens 10a can have current values different from the current values of the first component I and second component i of the excitation current through the second quadrupole lens 10b.

A case in which the astigmatic correction lens 10 is configured including the two quadrupole lenses 10a and 10b as shown in FIG. 2 has been described. The correction lens 10 may be configured including only one quadrupole lens 10a in an unillustrated manner. In this case, the astigmatic correction lens driver circuit 12 does not need to have a circuit portion for supplying current to the second quadrupole lens 10b.

1.2. Operation of Charged Particle Beam System

Figure 4:
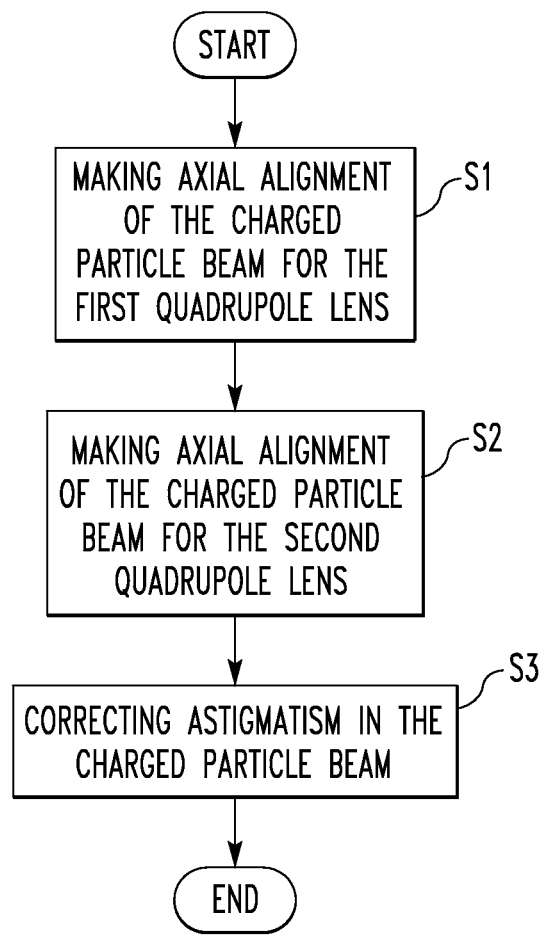
FIG. 4 is a flowchart illustrating a sequence of operations performed by the charged particle beam system shown in FIG. 1.

The operation of the charged particle beam system 100 associated with the present embodiment is next described by referring to the flowchart of FIG. 4.

In the charged particle beam system 100, axial alignment of the charged particle beam B is first made for the first quadrupole lens 10a of the astigmatic correction lens 10 (S1). Then, axial alignment of the beam B is made for the second quadrupole lens 10b of the correction lens 10 (S2). Subsequently, astigmatism in the beam B is corrected with the correction lens 10 (S3).

Figures 5, 6:
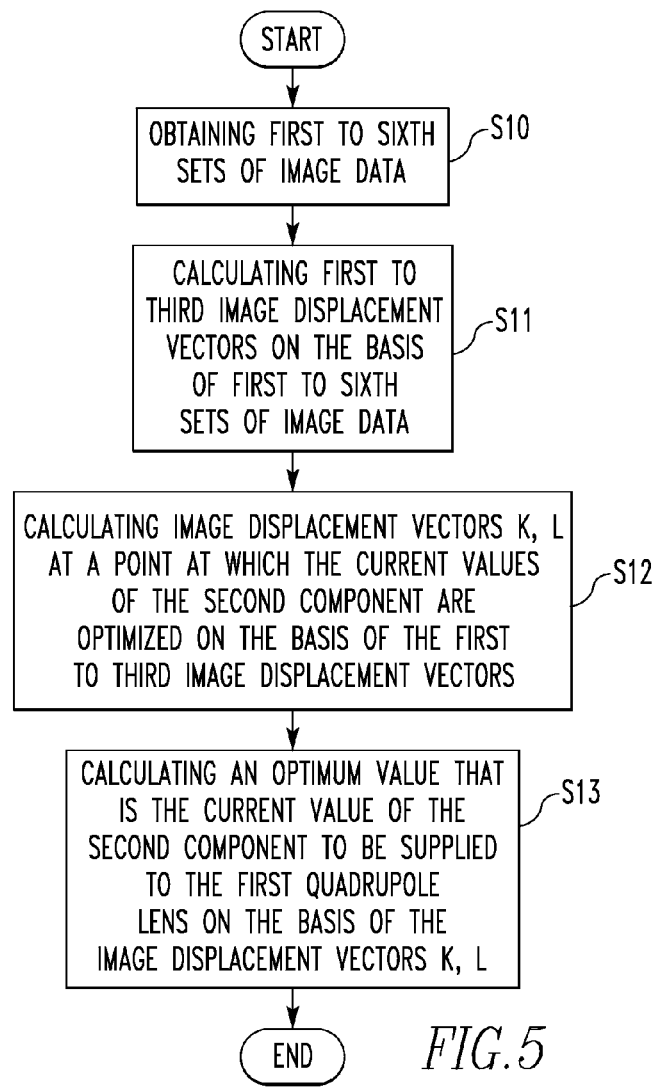
FIG. 5 is a flowchart illustrating a sequence of operations for axially aligning the charged particle beam in a first quadrupole lens included in the charged particle beam system shown in FIG. 1.
FIG. 6 is a table listing shooting conditions under which frames of image 1-6 are taken.

First, axial alignment of the charged particle beam B in the first quadrupole lens 10a is described (S1). That is, the axis of the beam B passing through the correction lens 10 and the central axis 10C of the first quadrupole lens 10a are aligned. FIG. 5 is a flowchart illustrating a sequence of operations for making axial alignment of the charged particle beam B in the first quadrupole lens 10a of the charged particle beam system 100.

First to sixth sets of image data are obtained by the axial alignment shooting condition setting device 30 (S10). The setting device 30 shoots frames of image 1-6 while varying the excitation currents J1-J4 through the first to fourth coils 101-104 to first to sixth sets of conditions described later. The frames 1-6 taken by the setting device 30 are stored as the first to sixth sets of image data in the frame memory 32a. Furthermore, the shooting conditions under which the frames 1-6 (first to sixth sets of image data) were taken are stored in the memory 32.

The setting device 30 for setting shooting conditions for axial alignment first sets the first quadrupole lens 10a to the first set of conditions. Specifically, the setting device 30 loads data about current values of the first components (I's) of the excitation currents J1-J4 through the first to fourth coils 101-104 under the first set of conditions into the register 202, loads data about the current values of the second components (i's) of the excitation currents J1 and J2 through the coils 101 and 102 under the first set of conditions into the register 204, and loads data about the current values of the second components (i's) of the excitation currents J3 and J4 through the coils 103 and 104 into the register 206. When the first quadrupole lens 10a is set to the first set of conditions, the sample S is scanned with the charged particle beam B and a first set of image data is obtained. At this time, the current value through the second quadrupole lens 10b is kept constant. Then, the setting device 30 similarly sets the first quadrupole lens 10a to the second set of conditions. The sample S is scanned with the beam B, and a second set of image data is derived. During the derivation of the second set of image data, only the conditions for the current value of the excitation current through the first quadrupole lens 10a vary in the charged particle beam system 100; the other conditions do not vary. That is, the conditions (such as the area scanned with the charged particle beam B and other lens operation conditions) excluding the current value of the excitation current through the first quadrupole lens 10a are the same for the case where the second set of image data is obtained and for the case where the first set of image data is obtained. The setting device 30 similarly obtains third to sixth sets of image data. Because of the steps described so far, the shooting condition setting device 30 for axial alignment can obtain the first to sixth sets of image data.

FIG. 6 is a table listing the shooting conditions under which frames of image are taken. In this table, $I_1$, $I_2$, $i_1$, $i_2$, $i_3$, and $i_4$ indicate current values which are given real numbers. The current values $I_1$ and $I_2$ are different from each other. Also, the current values $i_2$ and $i_3$ are different from each other. Furthermore, the current values $i_1$ and $i_4$ are different from each other.

Assuming that the excitation currents through the first coil 101, second coil 102, third coil 103, and fourth coil 104 are J1, J2, J3, and J4, respectively, the first to sixth sets of conditions under which the frames 1-6 of images are taken are as follows.

The first set of conditions (shooting conditions) under which the frame 1 is taken is given by $J1=I_1+i_1$, $J2=I_1-i_1$, $J3=I_1+i_2$, and $J4=I_1-i_2$. That is, under the first set of conditions, the first components (I's) of the excitation currents J1-J4 through the first to fourth coils 101-104 are equal to each other and equal to current value $I_1$. The second components (i's) of the excitation currents J1 and J2 through the first coil 101 and the second coil 102 are current values $+i_1$ and $-i_1$, respectively, which are opposite in sign and equal in absolute value. The second components (i's) of the excitation currents J3 and J4 through the third coil 103 and fourth coil 104 are current values $+i_2$ and $-i_2$, respectively, which are opposite in sign and equal in absolute value.

The second set of conditions (shooting conditions) under which the frame 2 is taken is given by $J1=I_2+i_1$, $J2=I_2-i_1$, $J3=I_2+i_2$, and $J4=I_2-i_2$. That is, under the second set of conditions, the first components (I's) of the first to fourth coils 101-104 are equal to each other and equal to current value $I_2$ different from the current value $I_1$. The second components (i's) through the first to fourth coils 101-104 are current values $+i_1$, $-i_1$, $+i_2$, and $-i_2$, respectively, which are the same as the current values of the second components (i's) through the first to fourth coils 101-104 under the first set of conditions.

The third set of conditions (shooting conditions) under which the frame 3 is taken is given by $J1=I_1+i_1$, $J2=I_1-i_1$, $J3=I_1+i_3$, and $J4=I_1-i_3$. That is, under the third set of conditions, the first components (I's) through the first to fourth coils are the current value $I_1$ that is equal to the first component I under the first set of conditions. The second components (i's) of the first coil 101 and the second coil 102 are the current values $+i_1$ and $-i_1$, respectively, which are the same as the current values of the second components (i's) through the first coil 101 and second coil 102 under the first set of conditions. The second components (i's) through the third coil 103 and fourth coil 104 are current values $+i_3$ and $-i_3$, which are opposite in sign and equal in absolute value and which are different in absolute value from the second component i through the third coil 103 under the first set of conditions.

The fourth sets of conditions (shooting conditions) under which the frame 4 is taken is given by $J1=I_2+i_1$, $J2=I_2-i_1$, $J3=I_2+i_3$, and $J4=I_2-i_3$. That is, under the fourth set of conditions, the first components (I's) through the first to fourth coils 101-104 are the current value $I_2$ that is the same as the current value of the first component I through the first coil 101 under the second set of conditions. The second components (i's) through the first to fourth coils 101-104 are current values $+i_1$, $-i_1$, $+i_3$, and $-i_3$, respectively, which are the same as the current values of the second components (i's) through the first to fourth coils 101-104 under the third set of conditions.

The fifth set of conditions (shooting conditions) under which the frame 5 is taken is given by $J1=I_1+i_4$, $J2=I_1-i_4$, $J3=I_1+i_2$, and $J4=I_1-i_2$. That is, under the fifth set of conditions, the first components (I's) through the first to fourth coils 101-104 are the current value $I_1$ that is the first component I under the first set of conditions. The second components (i's) through the first coil 101 and second coil 102 are current values $+i_4$ and $-i_4$, respectively, which are opposite in sign and equal in absolute value and which are different in absolute value from the second component i through the first coil 101 under the first set of conditions. The second components (i's) through the third coil 103 and fourth coil 104 are the current values $+i_2$ and $-i_2$, respectively, which are the same as the current values of the second components (i's) through the third coil 103 and fourth coil 104 under the first set of conditions.

The sixth set of conditions (shooting conditions) under which the frame 6 is taken is given by $J1=I_2+i_4$, $J2=I_2-i_4$, $J3=I_2+i_2$, and $J4=I_2-i_2$. That is, the first component (I's) through the first to fourth coils 101-104 are the current value $I_2$ which is the same as the current value of the first component I through the first coil 101 under the second set of conditions. The second components (i's) through the first to fourth coils 101-104 are the current values $+i_4$, $-i_4$, $+i_2$, and $-i_2$, respectively, which are the same as the second components (i's) through the first to fourth coils 101-104, respectively, under the fifth set of conditions.

The current values $I_1$, $I_2$, $i_1$, $i_2$, $i_3$, and $i_4$ are set into the shooting condition setting device 30 for axial alignment. For example, the current value $I_1$ is $I_1=I_0+\Delta I_0$, i.e., obtained by increasing the current value $I_0$ of the first components (I's) of the excitation currents through the coils 101-104 assumed at the beginning of axial alignment by a given current value $\Delta I_0$. The current value $I_2$ is $I_2=I_0-\Delta I_0$, i.e., obtained by reducing the initial value $I_0$ by the given current value $\Delta I_0$. The current value $i_1$ is the second component i of the excitation current through the first coil 101 at the beginning of the axial alignment. The current $i_2$ is the second component i of the excitation current through the third coil 103 at the beginning of the axial alignment. The current $i_3$ is $i_3=i_2+\Delta i_2$, i.e., obtained by increasing the current value $i_2$ by a given current value $\Delta i_2$. The current $i_4$ is $i_4=i_1+\Delta i_1$, i.e., obtained by increasing the current value $i_1$ by the given current value $\Delta i_1$. The current values $I_1$, $I_2$, $i_1$, $i_2$, $i_3$, and $i_4$ may be previously set into the shooting condition setting device 30 for axial alignment.

Where the initial value $i_1$ is positive, the amount of variation $\Delta i_1$ may be set to a negative value. Where the initial value $i_1$ is negative, the amount of variation $\Delta i_1$ may be set to a positive value. Similarly, where the initial value $i_2$ is positive, the amount of variation $\Delta i_2$ may be set to a negative value. Where the initial value $i_2$ is negative, the amount of variation $\Delta i_2$ may be set to a positive value. Since the optimum values of the second components (i's) through the coils 101-104 are often close to 0 in essence, the amounts of variation $\Delta i_1$ and $\Delta i_2$ can be previously set close to the optimum values X3 and Y3 (described later) of the second components (i's). Consequently, the optimum values X3 and Y3 can be computed with improved accuracy.

Then, the image displacement vector calculator 34 calculates a first image displacement vector A (a, b) indicative of the amount of positional deviation between an image (frame 1) indicated by a first set of image data and an image (frame 2) indicated by a second set of image data, a second image displacement vector B (c, d) indicative of the amount of positional deviation between an image (frame 3) indicated by a third set of image data and an image (frame 4) indicated by a fourth set of image data, and a third image displacement vector C (e, f) indicative of the amount of positional deviation between an image (frame 5) indicated by a fifth set of image data and an image (image 6) indicated by a sixth set of image data (S11).

Figure 7:
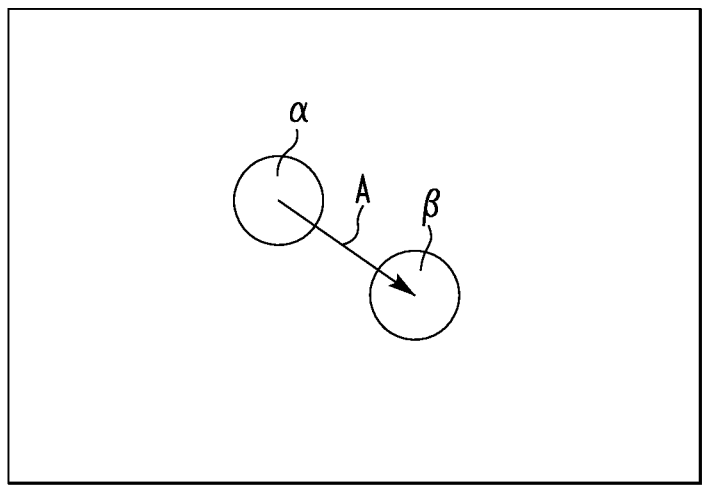
FIG. 7 is a diagram illustrating a first image displacement vector A.

An image displacement vector is a vector indicating the amount of positional deviation (direction and magnitude) between two images. FIG. 7 illustrates the first image displacement vector A. In FIG. 7, frames 1 and 2 are shown to be overlapped. The first image displacement vector A connects together an image α representing the sample S obtained from the frame 1 and an image β representing the sample S obtained from the frame 2. The first image displacement vector A indicates movement of an image caused by variations in the current values of the first components (I's) through the first to fourth coils 101-104 in a case where the current values of the second components (i's) through the first to fourth coils 101-104 are $+i_1$, $-i_1$, $+i_2$, and $-i_2$, respectively. Similarly, the second image displacement vector B indicates movement of an image caused by variations in the current values of the first components (I's) through the first to fourth coils 101-104 in a case where the current values of the second components (i's) through the first to fourth coils 101-104 are $+i_1$, $-i_1$, $+i_3$, and $-i_3$, respectively. Similarly, the third image displacement vector C indicates movement of an image caused by variations in the current values of the first components (I's) through the first to fourth coils 101-104 in a case where the current values of the second components (i's) through the first to fourth coils 101-104 are $+i_4$, $-i_4$, $+i_2$, and $i_2$, respectively.

An image displacement vector can be calculated, for example, by calculating a cross-correlation between two frames of images. In this case, the calculation of the cross-correlation is carried out by performing an inverse Fourier transform of the product of the complex conjugates of two-dimensional Fourier transforms of the two images. The coordinates of a maximum value of the results of the computation of the two-dimensional cross-correlation indicate an image displacement vector.

Figure 8:
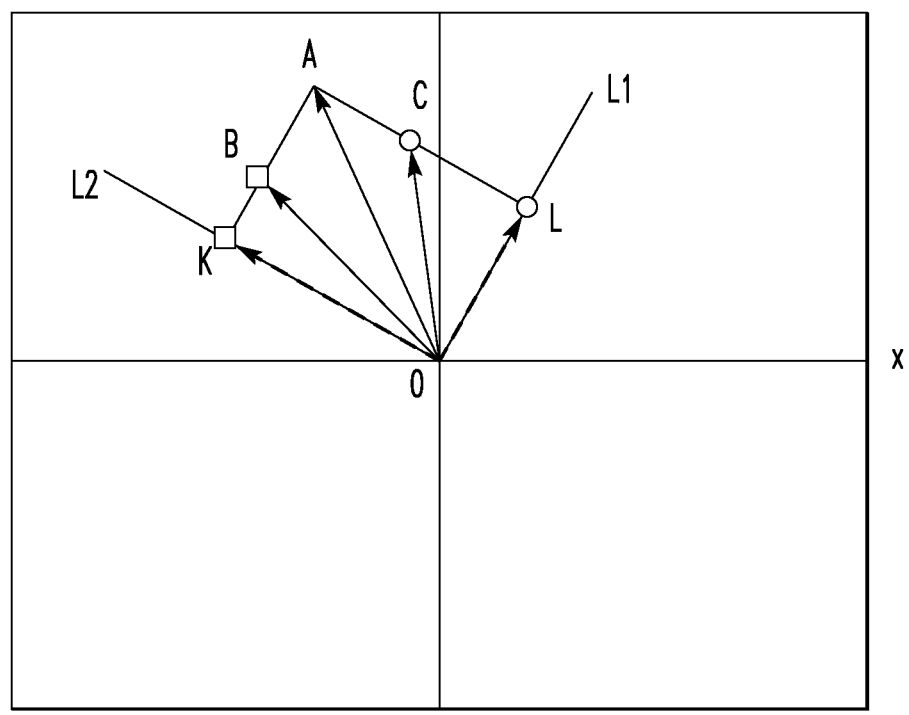
FIG. 8 is a diagram illustrating the relationship among image displacement vectors A, B, and C.

FIG. 8 shows the relationship among the image displacement vectors A, B, and C. The horizontal axis x indicates an x-component in an image displacement vector coordinate system. The vertical axis y indicates a y-component in the image displacement vector coordinate system.

The optimum value calculator 36 calculates an image displacement vector L (s, t) at an estimated optimum point at which the current values of the second component (i's) of the excitation currents J1 and J2 through the first and second coils 101 and 102 are optimum and an image displacement vector K (g, h) at an estimated optimum point at which the current values of the second components (i's) of the excitation currents J3 and J4 through the third and fourth coils 103 and 104 are optimum as shown in FIG. 8 (S12).

The current values of the second components (i's) through the coils 101 and 102 at the origin of FIG. 8 and the current values of the second components (i's) through the coils 103 and 104 are optimum values. Calculation of the current values at the origin of FIG. 8 is replaced by calculation of the current values at the image displacement vectors L and K. That is, a current value at point L shown in FIG. 8 is an estimated optimum point in the image displacement vector coordinate system at which current values of the second components (i's) through the coils 101 and 102 are an optimum value X3. Furthermore, a current value at point K shown in FIG. 8 is an estimated optimum point in the image displacement vector coordinate system at which current values of the second components (i's) through the coils 103 and 104 are an optimum value Y3. The optimum value X3 is the current value of the second components (i's) through the coils 101 and 102 when the axis of the charged particle beam B is coincident with the central axis 10C of the first quadrupole lens 10a. The optimum value Y3 is the current value of the second components (i's) through the coils 103 and 104 when the axis of the beam B coincidents with the central axis 10C of the first quadrupole lens 10a.

As shown in FIG. 8, a straight line AC meets at the point L (s, t) with a straight line L1 that is parallel to the straight line AB and passes through the origin. Similarly, the straight line AB meets at the point K (g, h) with a straight line L2 that is parallel to the straight line AC and passes through the origin.

For example, the image displacement vectors K (g, h) and L (s, t) are calculated from the following Eqs. (1)-(4).

$$g = \frac{(b \times c - a \times d) \times (a - e)}{(b - d) \times (a - e) - (a - c) \times (b - f)} \quad (1)$$

$$h = \frac{(b \times c - a \times d) \times (b - f)}{(b - d) \times (a - e) - (a - c) \times (b - f)} \quad (2)$$

$$s = \frac{(b \times e - a \times f) \times (a - c)}{(b - f) \times (a - c) - (a - e) \times (b - d)} \quad (3)$$

$$t = \frac{(b \times e - a \times f) \times (b - d)}{(b - f) \times (a - c) - (a - e) \times (b - d)} \quad (4)$$

Then, the optimum value calculator 36 computes the current values (optimum value X3) of the second components (i's) through the coils 101 and 102 at the vector L from the current values at the vectors A and C (S13).

Figure 9:
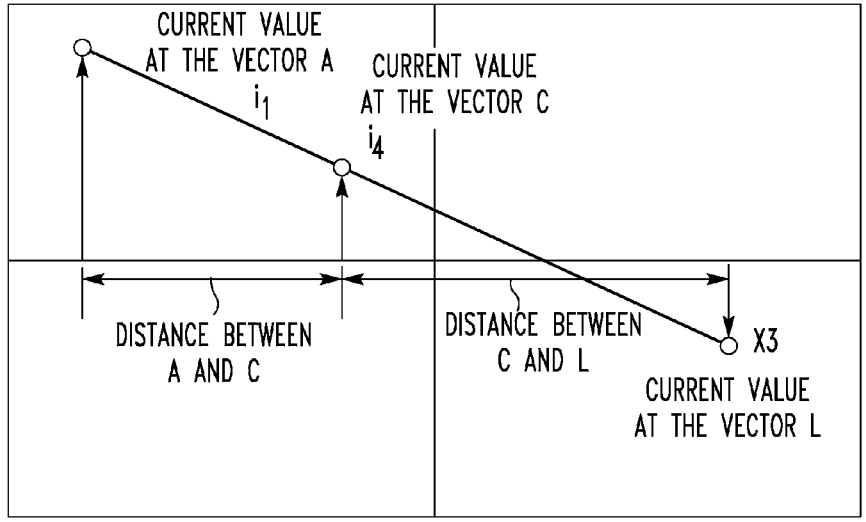
FIG. 9 is a diagram illustrating the relationships of the distances among vectors A, B, and C to the values of currents of the second components through first and second coils.

FIG. 9 is a diagram illustrating the relationship of the distances among the vectors A, C, and L to the current values of the second components (i's) through the coils 101 and 102. As shown in FIG. 9, the optimum value X3 of the second components (i's) through the coils 101 and 102 are computed from the current value $i_1$ at the vector A and from the current value $i_4$ at the vector C. The optimum value calculator 36 performs calculations, for example, using the current values $i_1$ and $i_4$ at the vectors A and C which are stored in the memory 32. The optimum value X3 of the second components (i's) through the coils 101 and 102 is calculated, for example, from the following Eqs. (5) and (6). Eq. (5) is used when the coordinate A of the vector A shown in FIG. 9 lies between the coordinate point C of the vector C and the coordinate point L of the vector L. Eq. (6) is used when the coordinate point A of the vector A does not lie between the coordinate point C of the vector C and the coordinate point L of the vector L.

$$X3 = \frac{(XA - XC) \times \sqrt{(s-a)^2 + (t-b)^2}}{\sqrt{(e-a)^2 + (f-b)^2}} + XA \quad (5)$$

-continued $$X3 = \frac{-(XA - XC) \times \sqrt{(s-a)^2 + (t-b)^2}}{\sqrt{(e-a)^2 + (f-b)^2}} + XA \quad (6)$$

where XA is the current value $i_1$ at the vector A and XC is the excitation current value $i_4$ at the vector C.

Figure 10:
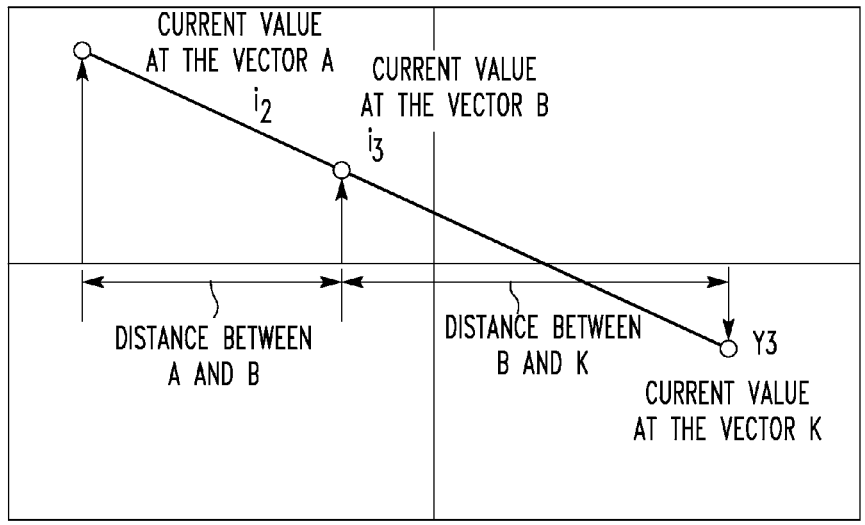
FIG. 10 is a diagram illustrating the relationships of the distances among vectors A, B, and K to the values of currents of the second components through third and fourth coils.

FIG. 10 shows the relationships of the distances among the vectors A, B, K to the current values of the second components (i's) through the coils 103 and 104. The optimum value calculator 36 computes the optimum value Y3 of the second components (i's) through the coils 103 and 104 from the excitation current value $i_2$ at the vector A and from the excitation current value $i_3$ at the vector B as shown in FIG. 10 (S13). For instance, the optimum value Y3 of the second components (i's) through the coils 103 and 104 is calculated from the following Eqs. (7) and (8). Eq. (7) is used when the coordinate point A of the vector A is located between the coordinate point B of the vector B and the coordinate point K of the vector K. Eq. (8) is used when the coordinate point A of the vector A is not located between the coordinate point B of the vector B and the coordinate point K of the vector K.

$$Y3 = \frac{(YA - YB) \times \sqrt{(g-a)^2 + (h-b)^2}}{\sqrt{(c-a)^2 + (d-b)^2}} + YA \quad (7)$$

$$Y3 = \frac{-(YA - YB) \times \sqrt{(g-a)^2 + (h-b)^2}}{\sqrt{(c-a)^2 + (d-b)^2}} + YA \quad (8)$$

where YA is the current value $i_2$ at the vector A and YB is the current value $i_3$ at the vector B.

Because of the steps described so far, the optimum value X3 of the second components (i's) through the coils 101 and 102 and the optimum value Y3 of the second components (i's) through the coils 103 and 104 can be computed.

The optimum value calculator 36 then generates control signals based on the calculated optimum values X3 and Y3 of the excitation currents through the coils 101-104, outputs the signals to the astigmatic correction lens driver circuit 12 shown in FIG. 3, loads the optimum value X3 into the register 204, and loads the optimum value Y3 into the register 206.

Because of the steps described so far, it is possible to make axial alignment of the charged particle beam B in the first quadrupole lens 10a.

Then, the charged particle beam B in the second quadrupole lens 10b is aligned axially (S2), i.e., the axis of the beam B passing through the astigmatic correction lens 10 is brought into coincidence with the central axis 10C of the second quadrupole lens 10b. In this axial alignment of the beam B in the second quadrupole lens 10b, the charged particle beam system 100 performs the same operation as performed to axially align the beam B in the first quadrupole lens 10a and so its detailed description is omitted. In the charged particle beam system 100, during the axial alignment of the beam B in the second quadrupole lens 10b, the excitation current for the first quadrupole lens 10a is fixed. For example, the current values of the second components (i's) through the coils 101-104 in the first quadrupole lens 10a are fixed at the optimum values calculated at the step S1.

Then, the astigmatism in the charged particle beam B is corrected using the astigmatic correction lens 10 (S3). In this step, the current values of the second components (i's) through the coils 101-108 constituting the correction lens 10 are fixed at the current values calculated at the steps S1 and S2. The astigmatism in the beam B is corrected by adjusting the current values of the first components (I's) through the coils 101-108. Alternatively, the present step may be carried out by calculating optimum values of the first components (I's) through the coils 101-108 by means of a processing portion (not shown) of the charged particle beam system 100. Still alternatively, the present step may be carried out by the user by varying the current values of the first components (I's) through the coils 101-108 and finding optimum values.

Because of the steps described so far, axial alignment of the charged particle beam B and correction of the astigmatism in the beam B can be performed.

In the present embodiment, the optimum values X3 and Y3 of the second components (i's) of the excitation currents through the coils 101-108 can be found from the 6 sets of image data (frames 1-6) as described previously. According to the present embodiment, only a limited number of sets of image data are required to be obtained in order to axially align the charged particle beam in this way. Therefore, it is easy to align the beam axially. Accordingly, the burden on the operator of the apparatus is reduced. The time taken to make axial alignment of the beam can be shortened.

The charged particle beam system associated with the present embodiment has the axial alignment shooting condition setting device 30 for obtaining the first to sixth sets of image data while varying the currents flowing through the first to fourth coils 101-104 and the image displacement vector calculator 34 and optimum value calculator 36 for calculating the current values of the second components (i's) through the first to fourth coils 101-104 for correcting the position of the axis of the charged particle beam B passing through the astigmatic correction lens 10 based on the first to sixth sets of image data. Consequently, the charged particle beam can be easily aligned axially in the first quadrupole lens 10a of the astigmatic correction lens 10. Furthermore, axial alignment of the beam B can be automated.

1.3. Modifications

Modifications of the method of axially aligning the charged particle beam in the charged particle beam system associated with the present embodiment are next described.

In the above embodiment, the image displacement vectors A, B, and C are computed after completion of acquisition of the first to sixth sets of image data. Alternatively, at the moment when the first and second sets of image data are successfully obtained, the image displacement vector A may be calculated. At the moment when the third and fourth sets of image data are successfully obtained, the image displacement vector B may be calculated. At the moment when the fifth and sixth sets of image data are successfully obtained, the image displacement vector C may be calculated. Thus, acquisition of image data and calculation of the image displacement vector can be carried out in parallel. The time taken to make axial alignment of the charged particle beam can be shortened further.

It is to be noted that the above embodiments are merely exemplary and that the invention is not restricted thereto. For example, the embodiments may be appropriately combined.

For instance, the functions of the axial alignment shooting condition setting device 30, image displacement vector calculator 34, and optimum value calculator 36 may be implemented by hardware such as various processors (e.g., CPU and DSP) or ASIC (such as a gate array) or by software "structured to perform the steps set forth in FIGS. 4-6 as further described in the corresponding written description".

Furthermore, in the above example of the charged particle beam system 100, the charged particle beam is axially aligned by adjusting the second components (i's) of the excitation currents of the coils 101-104 of the astigmatic correction lens 10. A deflection coil for deflecting the charged particle beam B may be mounted independently of the astigmatic correction lens 10. The beam may be axially aligned by finding optimum values of the currents flowing through the deflection coil. At this time, the optimum values of the currents flowing through the deflection coil can be calculated in the same way as in the above embodiments.

The present invention embraces configurations substantially identical (e.g., in function, method, and results or in purpose and advantageous effects) with the configurations described in the above embodiments of the invention. Furthermore, the invention embraces configurations described in the embodiments and including portions which have nonessential portions replaced. In addition, the invention embraces configurations which produce the same advantageous effects as those produced by the configurations described in the preferred embodiments or which can achieve the same objects as the configurations described in the preferred embodiments. Further, the invention embraces configurations which are similar to the configurations described in the preferred embodiments except that well-known techniques have been added.

Having thus described my invention with the detail and particularity required by the Patent Laws, what is desired protected by Letters Patent is set forth in the following claims.

The invention claimed is:

1. A method of making axial alignment of a charged particle beam by a charged particle beam system having an astigmatic correction lens including a first pair of coils and a second pair of coils, the first pair of coils consisting of first and second coils which are located on opposite sides of the axis of the charged particle beam, the first and second coils having opposite coil surfaces having magnetic poles of a first polarity, the second pair of coils consisting of third and fourth coils which are located on opposite sides of the axis of the charged particle beam, the third and fourth coils having opposite coil surfaces having magnetic poles of a second polarity different from the first polarity, the second pair of coils being angularly spaced from the first pair of coils, said method comprising the steps of:

obtaining first to sixth sets of image data while varying currents flowing through the first to fourth coils according to first to sixth sets of conditions; and then calculating the values of the currents through the first to fourth coils for correcting the position of the axis of the charged particle beam passing through the astigmatic correction lens based on the first to sixth sets of image data, wherein electric current J flowing through each of the first to fourth coils is the sum I+i(J=I+i), where I is a first component of the current J for correcting astigmatism and i is a second component of the current J for correcting the position of the axis of the charged particle beam;

wherein under the first set of conditions, the first components (I's) through the first to fourth coils are equal to each other and equal to a given current value $I_1$, the second currents (i's) through the first and second coils, respectively, are current values $+i_1$ and $-i_1$, respectively, which are equal to each other in absolute value but opposite in sign, and the second currents (i's) through the third and fourth coils, respectively, are current values $+i_2$ and $-i_2$, respectively, which are equal to each other in absolute value but opposite in sign;

wherein under the second set of conditions, the first components (I's) through the first to fourth coils are equal to each other and equal to a current value $I_2$ different from the given current value, the second components (i's) through the first to fourth coils are current values $+i_1$, $-i_1$, $+i_2$, and $-i_2$, respectively, which are the same as the current values of the second components through the first to fourth coils, respectively, under the first set of conditions;

wherein under the third set of conditions, the first components (I's) of the first to fourth coils are equal to the given current value $I_1$ flowing under the first set of conditions, the second components (i's) through the first and second coils are current values $+i_1$ and $-i_1$, respectively, which are the same as the current values of the second components through the first and second coils, respectively, under the first set of conditions, and the second components (i's) through the third and fourth coils are current values $+i_1$ and $-i_3$, respectively, which are equal to each other in absolute value but opposite in sign and which are different in absolute value from the second component through the third coil under the first set of conditions;

wherein under the fourth set of conditions, the first components (I's) through the first to fourth coils are current value $I_2$ which is the same as the current value of the first component through the first coil under the second set of conditions, the second components (i's) through the first to fourth coils are current values $+i_1$, $-i_1$, $+i_3$, and $-i_3$, respectively, which are the same as the current values of the second components through the first to fourth coils, respectively, under the third set of conditions;

wherein under the fifth set of conditions, the first components (I's) through the first to fourth coils are the given current value $I_1$ flowing under the first set of conditions, the second components (i's) through the first and second coils, respectively, are current values $+i_4$ and $-i_4$, respectively, which are equal to each other in absolute value but opposite in sign and which are different in absolute value from the second component through the first coil under the first set of conditions, the second components (i's) through the third and fourth coils, respectively, are current values $+i_2$ and $-i_2$, respectively, which are the same as the current values of the second components through the third and fourth coils, respectively, under the first set of conditions; and wherein under the sixth set of conditions, the first components (I's) through the first to fourth coils, respectively, are current value $I_2$ identical with the current value of the first component through the first coil under the second set of conditions, the second components (i's) through the first to fourth coils, respectively, are current values $+i_4$, $-i_4$, $+i_2$, and $-i_2$, respectively, which are the same as the current values of the second components through the first to fourth coils, respectively, flowing under the fifth set of conditions, and adjusting the currents in the first to fourth coils to correspond to the calculated values.

2. The method of making axial alignment of a charged particle beam as set forth in claim 1, wherein during the step of calculating the values of the currents, a first image displacement vector indicative of an amount of positional deviation between an image indicated by the first set of image data and an image indicated by the second set of image data, a second image displacement vector indicative of an amount of positional deviation between an image indicated by the third set of image data and an image indicated by the fourth set of image data, and a third image displacement vector indicative of an amount of positional deviation between an image indicated by the fifth set of image data and an image indicated by the sixth set of image data are calculated, and wherein the second components (i's) through the first to fourth coils are calculated based on the first to third image displacement vectors.

3. A method of making axial alignment of a charged particle beam by a charged particle beam system having an astigmatic correction lens including a first pair of coils and a second pair of coils, the first pair of coils consisting of first and second coils which are located on opposite sides of the axis of the charged particle beam, the first and second coils being energized with currents flowing in opposite directions, respectively, the second pair of coils consisting of third and fourth coils which are located on opposite sides of the axis of the charged particle beam, the third and fourth coils being energized with currents flowing in opposite directions, respectively, the second pair of coils being angularly spaced from the first pair of coils, said method comprising the steps of:

obtaining first to sixth sets of image data while varying the currents flowing through the first to fourth coils according to first to sixth sets of conditions;

calculating the values of the currents through the first to fourth coils for correcting the position of the axis of the charged particle beam passing through the astigmatic correction lens based on the first to sixth sets of image data;

wherein electric current J flowing through each of the first to fourth coils is the sum I+i (J=I+i), where I is a first component of the current J for correcting astigmatism and i is a second component of the current J for correcting the position of the axis of the charged particle beam, wherein under the first set of conditions, the first components (I's) through the first to fourth coils are equal to each other and equal to a given current value $I_1$, the second currents (i's) through the first and second coils, respectively, are current values $+i_1$ and $-i_1$, respectively, which are equal to each other in absolute value but opposite in sign, the second currents (i's) through the third and fourth coils, respectively, are current values $+i_2$ and $-i_2$, respectively, which are equal to each other in absolute value but opposite in sign;

wherein under the second set of conditions, the first components (I's) through the first to fourth coils are equal to each other and equal to a current value $I_2$ different from the given current value $I_1$, the second components (i's) through the first to fourth coils are current values $+i_1$, $-i_1$, $+i_2$, and $-i_2$, respectively, which are the same as the current values of the second components through the first to fourth coils, respectively, under the first set of conditions;

wherein under the third set of conditions, the first components (I's) through the first to fourth coils are the given current value L flowing under the first set of conditions, the second components (i's) through the first and second coils are current values $+i_1$ and $-i_1$, respectively, which are the same as the current values of the second components through the first and second coils, respectively, under the first set of conditions, and the second components (i's) through the third and fourth coils are current values $+i_3$ and $-i_3$, respectively, which are equal to each other in absolute value but opposite in sign and which are different in absolute value from the second component through the third coil under the first set of conditions;

wherein under the fourth set of conditions, the first components (I's) through the first to fourth coils are current value $I_2$ which is the same as the current value of the first component through the first coil under the second set of conditions, the second components (i's) through the first to fourth coils are current values $+i_1$, $-i_1$, $+i_3$, and $-i_3$, respectively, which are the same as the current values of the second components through the first to fourth coils, respectively, under the third set of conditions;

wherein under the fifth set of conditions, the first components (I's) through the first to fourth coils are the given current value $I_1$ flowing under the first set of conditions, the second components (i's) through the first and second coils, respectively, are current values $+i_4$ and $-i_4$, respectively, which are equal to each other in absolute value but opposite in sign and which are different in absolute value from the second component through the first coil under the first set of conditions, and the second components (i's) through the third and fourth coils, respectively, are current values $+i_2$ and $-i_2$, respectively, which are the same as the current values of the second components through the third and fourth coils, respectively, under the first set of conditions; and wherein under the sixth set of conditions, the first components (I's) through the first to fourth coils, respectively, are current value $I_2$ identical with the current value of the first component through the first coil under the second set of conditions, and the second components (i's) through the first to fourth coils, respectively, are current values $+i_4$, $-i_4$, $+i_2$, and $-i_2$, respectively, which are the same as the current values of the second components through the first to fourth coils, respectively, flowing under the fifth set of conditions.

4. The method of making axial alignment of a charged particle beam as set forth in claim 3, wherein during the step of calculating the values of the currents, a first image displacement vector indicative of an amount of positional deviation between an image indicated by the first set of image data and an image indicated by the second set of image data, a second image displacement vector indicative of an amount of positional deviation between an image indicated by the third set of image data and an image indicated by the fourth set of image data, and a third image displacement vector indicative of an amount of positional deviation between an image indicated by the fifth set of image data and an image indicated by the sixth set of image data are calculated, and wherein the second components (i's) through the first to fourth coils are calculated based on the first to third image displacement vectors.

5. A charged particle beam system equipped with an astigmatic correction lens including a first pair of coils and a second pair of coils, the first pair of coils consisting of first and second coils which are located on opposite sides of the axis of a charged particle beam, the first and second coils having opposite coil surfaces having magnetic poles of a first polarity, the second pair of coils consisting of third and fourth coils which are located on opposite sides of the axis of the charged particle beam, the third and fourth coils having opposite coil surfaces having magnetic poles of a second polarity different from the first polarity, the second pair of coils being angularly spaced from the first pair of coils, said charged particle beam system comprising:

image data acquisition means for obtaining first to sixth sets of image data while varying currents flowing through the first to fourth coils, respectively, according to first to sixth sets of conditions; and calculation means for calculating the values of the currents flowing through the first to fourth coils for correcting the position of the axis of the charged particle beam passing through the astigmatic correction lens based on the first to sixth sets of image data, wherein electric current J flowing through each of the first to fourth coils is the sum I+i (J=I+i), where I is a first component of the current J for correcting astigmatism and i is a second component of the current J for correcting the position of the axis of the charged particle beam;

wherein under the first set of conditions, the first components (I's) through the first to fourth coils are equal to each other and equal to a given current value $I_1$, the second currents (i's) through the first and second coils, respectively, are current values $+i_1$ and $-i_1$, respectively, which are equal to each other in absolute value but opposite in sign, and the second currents (i's) through the third and fourth coils, respectively, are current values $+i_2$ and $-i_2$, respectively, which are equal to each other in absolute value but opposite in sign;

wherein under the second set of conditions, the first components (I's) through the first to fourth coils are equal to each other and equal to a current value $I_2$ different from the given current value and the second components (i's) through the first to fourth coils are current values $+i_1$, $-i_1$, $+i_2$, and $-i_2$, respectively, which are the same as the current values of the second components through the first to fourth coils, respectively, under the first set of conditions;

wherein under the third set of conditions, the first components (I's) through the first to fourth coils are the given current value $I_1$ flowing under the first set of conditions, the second components (i's) through the first and second coils are current values $+i_1$ and $-i_1$, respectively, which are the same as the current values of the second components through the first and second coils, respectively, under the first set of conditions, and the second components (i's) through the third and fourth coils are current values $+i_3$ and $-i_3$, respectively, which are equal to each other in absolute value but opposite in sign and which are different in absolute value from the second component through the third coil under the first set of conditions;

wherein under the fourth set of conditions, the first components (I's) through the first to fourth coils are current value $I_2$ which is the same as the current value of the first component through the first coil under the second set of conditions, the second components (i's) through the first to fourth coils are current values $+i_1$, $-i_1$, $+i_3$, and $-i_3$, respectively, which are the same as the current values of the second components through the first to fourth coils, respectively, under the third set of conditions;

wherein under the fifth set of conditions, the first components (I's) through the first to fourth coils are the given current value $I_1$ flowing under the first set of conditions, the second component (i's) through the first and second coils, respectively, are current values $+i_4$ and $-i_4$, respectively, which are equal to each other in absolute value but opposite in sign and which are different in absolute value from the second component through the first coil under the first set of conditions, and the second components (i's) through the third and fourth coils, respectively, are current values $+i_2$ and $-i_2$, respectively, which are equal to the current values of the second components through the third and fourth coils, respectively, under the first set of conditions; and wherein under the sixth set of conditions, the first components (I's) through the first to fourth coils, respectively, are current value $I_2$ identical with the current value of the first component through the first coil under the second set of conditions, and the second components (i's) through the first to fourth coils, respectively, are current values $+i_4$, $-i_4+i_2$, and $-i_2$, respectively, which are the same as the current values of the second components through the first to fourth coils, respectively, flowing under the fifth set of conditions.

6. The charged particle beam system as set forth in claim 5, wherein said calculation means calculates a first image displacement vector indicative of an amount of positional deviation between an image indicated by the first set of image data and an image indicated by the second set of image data, a second image displacement vector indicative of an amount of positional deviation between an image indicated by the third set of image data and an image indicated by the fourth set of image data, and a third image displacement vector indicative of an amount of positional deviation between an image indicated by the fifth set of image data and an image indicated by the sixth set of image data, and wherein the calculation means calculates said second components (i's) through the first to fourth coils based on the first to third image displacement vectors.

7. A charged particle beam system equipped with an astigmatic correction lens including a first pair of coils and a second pair of coils, the first pair of coils consisting of first and second coils which are located on opposite sides of the axis of a charged particle beam, the first and second coils being energized with currents flowing in opposite directions, respectively, the second pair of coils consisting of third and fourth coils which are located on opposite sides of the axis of the charged particle beam, the third and fourth coils being energized with currents flowing in opposite directions, respectively, the second pair of coils being angularly spaced from the first pair of coils, said charged particle beam system comprising:

image data acquisition means for obtaining first to sixth sets of image data while varying the currents flowing through the first to fourth coils according to first to sixth sets of conditions; and calculation means for calculating the values of the currents through the first to fourth coils for correcting the position of the axis of the charged particle beam passing through the astigmatic correction lens based on the first to sixth sets of image data, wherein electric current J flowing through each of the first to fourth coils is the sum I+i (J=I+i), where I is a first component of the current J for correcting astigmatism and i is a second component of the current J for correcting the position of the axis of the charged particle beam;

wherein under the first set of conditions, the first components (I's) through the first to fourth coils are equal to each other and equal to a given current value $I_1$, the second currents (i's) through the first and second coils, respectively, are current values $+i_1$ and $-i_1$, respectively, which are equal to each other in absolute value but opposite in sign, and the second components (i's) through the third and fourth coils, respectively, are current values $+i_2$ and $-i_2$, respectively, which are equal to each other in absolute value but opposite in sign;

wherein under the second set of conditions, the first components (I's) through the first to fourth coils are equal to each other and equal to a current value $I_2$ different from the given current value $I_1$ and the second components (i's) through the first to fourth coils are current values $+i_1$, $-i_1$, $+i_2$, and $-i_2$, respectively, which are the same as the current values of the second components through the first to fourth coils, respectively, under the first set of conditions;

wherein under the third set of conditions, the first components (I's) through the first to fourth coils are the given current value $I_1$ flowing under the first set of conditions, the second components (i's) through the first and second coils are current values $+i_1$ and $-i_1$, respectively, which are the same as the current values of the second components through the first and second coils, respectively, under the first set of conditions, and the second components (i's) through the third and fourth coils are current values $+i_3$ and $-i_3$, respectively, which are equal to each other in absolute value but opposite in sign and which are different in absolute value from the second component through the third coil under the first set of conditions;

wherein under the fourth set of conditions, the first components (I's) through the first to fourth coils are current value $I_2$ which is the same as the current value of the first component through the first coil under the second set of conditions and the second components (i's) through the first to fourth coils are current values $+i_1$, $-i_1$, $+i_3$, and $-i_3$, respectively, which are the same as the current values of the second components through the first to fourth coils, respectively, under the third set of conditions;

wherein under the fifth set of conditions, the first components (I's) through the first to fourth coils are the given current value $I_1$ flowing under the first set of conditions, the second components (i's) through the first and second coils, respectively, are current values $+i_4$ and $-i_4$, respectively, which are equal to each other in absolute value but opposite in sign and which are different in absolute value from the second component through the first coil under the first set of conditions, and the second components (i's) through the third and fourth coils, respectively, are current values $+i_2$ and $-i_2$, respectively, which are the same as the current values of the second components through the third and fourth coils, respectively, under the first set of conditions; and wherein under the sixth set of conditions, the first components (I's) through the first to fourth coils, respectively, are current value $I_2$ identical with the current value of the first component through the first coil under the second set of conditions, and the second components (i's) through the first to fourth coils, respectively, are current values $+i_4$, $-i_4$, $+i_2$, and $-i_2$, respectively, which are the same as the current values of the second components through the first to fourth coils, respectively, flowing under the fifth set of conditions.

8. The charged particle beam system as set forth in claim 7, wherein said calculation means calculates a first image displacement vector indicative of an amount of positional deviation between an image indicated by the first set of image data and an image indicated by the second set of image data, a second image displacement vector indicative of an amount of positional deviation between an image indicated by the third set of image data and an image indicated by the fourth set of image data, and a third image displacement vector indicative of an amount of positional deviation between an image indicated by the fifth set of image data and an image indicated by the sixth set of image data, and wherein the calculation means calculates said second components (i's) through the first to fourth coils based on the first to third image displacement vectors.

* * * * *

UNITED STATES PATENT AND TRADEMARK OFFICE
CERTIFICATE OF CORRECTION

PATENT NO. : 9,035,550 B2
APPLICATION NO. : 13/904098
DATED : May 19, 2015
INVENTOR(S) : Mitsuru Yamada It is certified that error appears in the above-identified patent and that said Letters Patent is hereby corrected as shown below:

In the Claims

Column 23, Line 53, Claim 3, delete "L" and insert -- $I_1$ --

Column 26, Line 4, Claim 5, delete "-$i_4$+$i_2$," and insert -- -$i_4$, +$i_2$, --

Signed and Sealed this
Tenth Day of November, 2015

Michelle K. Lee
*Director of the United States Patent and Trademark Office*